Figure 1:
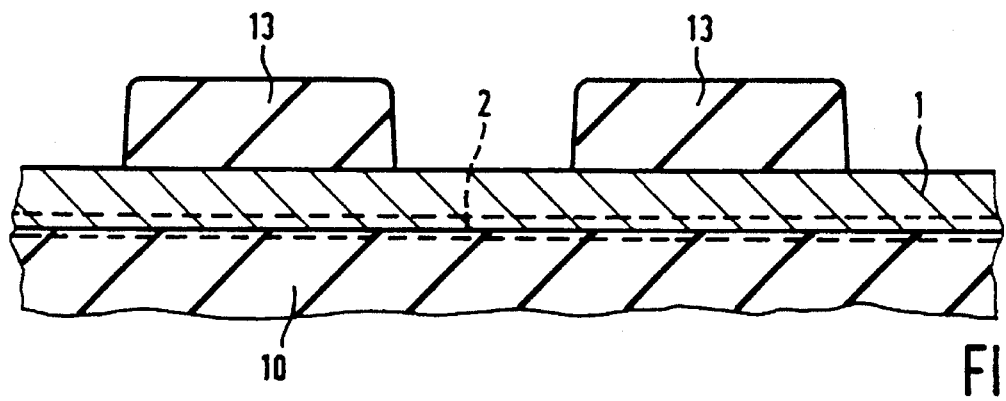

United States Patent [19]

Brotherton

[11] Patent Number: 5,488,001
[45] Date of Patent: Jan. 30, 1996

[54] MANUFACTURE OF ELECTRONIC DEVICES COMPRISING THIN-FILM TRANSISTORS USING AN ION IMPLANTATION MASK HAVING BEVELLED EDGES

[75] Inventor: Stanley D. Brotherton, Forest Row, England

[73] Assignee: U.S. Philips Corporation, New York, N.Y.

[21] Appl. No.: 281,967

[22] Filed: Jul. 28, 1994

[30] Foreign Application Priority Data

Jul. 30, 1993 [GB] United Kingdom .................... 9315798

[51] Int. Cl.$^6$ .......................... H01L 21/336; H01L 21/84
[52] U.S. Cl. ........................... 437/21; 437/228; 437/233; 437/40; 437/931; 148/DIG. 161
[58] Field of Search ................................ 437/21, 40, 228, 437/233, 931, 947, 981, 157, 986; 148/DIG. 161, DIG. 150

[56] References Cited

U.S. PATENT DOCUMENTS

| | | | |
|---|---|---|---|
| 3,890,632 | 6/1975 | Ham et al. ..................... | 148/DIG. 150 |
| 3,897,274 | 7/1975 | Stehlin et al. ................... | 437/40 |
| 4,070,211 | 1/1978 | Harari .......................... | 437/158 |
| 4,178,191 | 12/1979 | Flatley ......................... | 437/21 |
| 4,252,574 | 2/1981 | Fabula . | |
| 4,277,884 | 7/1981 | Hsu ........................... | 437/228 |
| 4,393,572 | 7/1983 | Policastro et al. ................. | 437/21 |
| 4,474,623 | 10/1984 | Adlerstein ...................... | 437/21 |
| 4,575,925 | 3/1986 | Kanbara et al. .................. | 437/21 |
| 4,649,626 | 3/1987 | Leong .......................... | 437/158 |
| 5,053,345 | 10/1991 | Schnable et al. .................. | 437/21 |
| 5,346,839 | 9/1994 | Sundaresan ..................... | 437/21 |

FOREIGN PATENT DOCUMENTS

| | | |
|---|---|---|
| 0408129 | 1/1991 | European Pat. Off. . |
| 0464897 | 1/1992 | European Pat. Off. . |
| 0561462 | 9/1993 | European Pat. Off. . |

OTHER PUBLICATIONS

N. D. Young & A. Gill, "Water-related instability in TFTs formed using deposited gate oxides," Semicond. Sci. Technol. 7, 1992, pp. 1103–1108.

Primary Examiner—Mary Wilczewski
Attorney, Agent, or Firm—Michael J. Balconi-Lamica

[57] ABSTRACT

In the manufacture of a liquid-crystal display or other large area electronic device, thin-film transistors are formed on a substrate (10) from a thin film (1) of disordered semiconductor material which accommodates the transistor channel regions and has a high density of trapping states. A masking pattern (13) masks areas of the semiconductor film (1) where the thin-film transistors are to be formed. The unmasked areas of the film (1) are etched away to leave the semiconductor film bodies for the transistors. The resulting transistors are found to have an undesirable leakage current through the channel region, even after adopting several prior art measures to reduce the high leakage. By implanting a dopant stripe (5) along their edges, the present invention reduces leakage currents along the edges of the channel region in the etched disordered semiconductor material (1). The implantation of ions (15) is effected through bevelled edge portions (13) of the masking pattern (13) so as to form the dopant stripe (5) across the thickness of the semiconductor film material (10). The thickness of the masking pattern (13) is sufficient to mask against implantation of the ions (15) except below the bevelled edge portions (14). The technology is compatible with the use of a substrate (10) not able to withstand temperatures of more than about 700° C.

11 Claims, 3 Drawing Sheets

MANUFACTURE OF ELECTRONIC DEVICES COMPRISING THIN-FILM TRANSISTORS USING AN ION IMPLANTATION MASK HAVING BEVELLED EDGES

BACKGROUND OF THE INVENTION

This invention relates to methods of manufacturing an electronic device comprising thin-film transistors formed on a substrate. The device may be, for example, a liquid crystal display or other flat panel display, or any other type of large area electronic device, for example, a thin-film data store or an image sensor. The invention also relates to such electronic devices manufactured by such methods.

There is currently much interest in developing thin-film field-effect transistors (hereinafter termed "TFTs") on glass and other insulating substrates for large area electronics applications, for example flat panel displays. Such TFTs fabricated with amorphous or polycrystalline semiconductor films may form, for example, switching elements of a cell matrix, e.g. as described in published European patent application EP-A-0 464 897 (our reference PHB 33646), the whole contents of which are hereby incorporated herein as reference material. A recent development involves the fabrication and integration of circuits from TFTs (often using polycrystalline silicon), for example integrated drive circuits for the matrix of a flat-panel display.

In the manufacture of such electronic devices, it is usual to form thin-film transistors on a substrate by steps which include: (a) depositing a disordered material on the substrate to provide a semiconductor film in which channel regions of the transistors are to be accommodated, charge-trapping states being present in the semiconductor film, (b) providing a masking pattern on the semiconductor film to mask areas where the thin-film transistors are to be formed, (c) etching away the unmasked areas of the film from the substrate to leave semiconductor film bodies for the transistors, and (d) providing the semiconductor film bodies with electrodes forming a source, a drain and an insulated gate of each transistor, the transistor current flow through the channel region between the source and drain being by charge carriers of a first conductivity type under the control of the insulated gate in operation of the transistor.

For polycrystalline silicon TFTs, the semiconductor film may be deposited as polycrystalline silicon, or it may be deposited as amorphous silicon which is subsequently converted in situ on the substrate into polycrystalline silicon by heating either in a furnace or with a laser beam. However, even when the resulting film is of large grain polycrystalline silicon, it has a high density of charge trapping states due to the disorder in the film. These charge trapping states cause the material to behave quite differently from monocrystalline silicon. Thus, for example, TFTs (even with large-grain polycrystalline silicon) have a high leakage current and a high threshold voltage as compared with field-effect transistors formed in monocrystalline silicon. Furthermore low doping levels have little or no effect in changing the generally intrinsic conductivity type of the film which results from the high density of trapping levels near the middle of the bandgap of the semiconductor material. However it is known that passivating treatments can be (and preferably are) carried out on the disordered thin-film semiconductor material to improve its properties. Thus, in the case of polycrystalline silicon, a hydrogenation treatment is usually effected to passivate the trapping states at the grain boundaries.

In order to secure a reduction in the leakage current of a TFT, it is known from published European patent application EP-A-0 408 129 (our reference PHB33571) to implant dopant of a second conductivity type (opposite to that of the charge-carriers of the conduction channel) at the back of the channel region. The whole contents of EP-A-0 408 129 are hereby incorporated herein as reference material. Such a dopant implantation may be effected either before or after the etching step (c) to define the film bodies for the transistors. This treatment is remarkably effective. However even after providing such an implant and passivating the grain boundaries, the Applicant now finds that there remains a leakage current whose magnitude it would be desirable to reduce even further. The Applicant finds that although the leakage current decreases with decreasing width of the channel region (i.e. reducing the volume of material), there remains a current level for a given film thickness beyond which it does not seem possible to reduce the leakage current by these known means.

There appears to be a variety of effects which both individually and in combination result in a significant edge leakage current along the side-wall of the channel region. These effects arise both from the nature of the thin-film materials and processes used in TFT manufacture and from the TFT structure. Both mobile ion effects and charge carrier trapping effects appear to be involved. The topographical structure of the top (or bottom) surface of the thin-film body adjacent to the insulated gate is determined (inter alia) by the material deposition and growth, whereas the structure of the edges (i.e. the side walls) of the TFT body is determined by the etching away of the material in step (c). This etched edge of the disordered material has different properties and can absorb different impurities, as compared with the top and bottom surfaces. As already mentioned, the TFT channel region has a high density of trapping states due to the disordered nature of its semiconductor material. Charge may be trapped in surface states at an interface between the disordered semiconductor material and the gate insulating layer where it extends on the edge of the TFT body. When the drain is reverse-biased in the off state of the TFT, extra generation of electron-hole pairs may occur in the field area at the edge of the channel region between the gate and the drain. Leakage current due to field-enhanced generation of carriers increases with drain bias. Furthermore, the gate insulating layer may have a contributing effect; for example, if the deposited insulated layer is thinner at the edge of the channel region, a higher field results in this area between the gate and drain. The paper "Water-Related Instability In TFTs Formed Using Deposited Gate Oxides" by N. D. Young and A. Gill in Semicond. Sci. Technol. Vol 7 (1992) pages 1003 to 1108, published by IOP Publishing Ltd in the UK, also describes an instability effect involving the build-up of ions on the side-walls (edges) of the channel regions due to water diffusion into the undensified gate oxide insulating layer. The whole contents of this paper are hereby incorporated herein as reference material.

SUMMARY OF THE INVENTION

It is an aim of the present invention to permit a further reduction in the leakage current of TFTs.

According to the present invention there is provided a method of manufacturing an electronic device comprising thin-film transistors formed on a substrate by steps which include: (a) depositing a disordered material on the substrate to provide a semiconductor film in which channel regions of the transistors are to be accommodated, charge-trapping states being present in the semiconductor film, (b) providing a masking pattern on the semiconductor film to mask areas where the thin-film transistors are to be formed, (c) etching away the unmasked areas of the film from the substrate to leave semiconductor film bodies for the transistors, and (d) providing the semiconductor film bodies with electrodes forming a source, a drain and an insulated gate of each transistor, the transistor current flow through the channel region between the source and drain being by charge carriers of a first conductivity type under the control of the insulated gate in operation of the transistor; according to the invention such a method is characterised in that the masking pattern is provided with bevelled edge portions which are present when an implantation step (e) is carried out to implant ions of a second conductivity type dopant into the semiconductor film material, the thickness of the masking pattern in step (c) being sufficiently large as to mask the underlying semiconductor film against implantation of the ions except below the bevelled edge portions where the ions are implanted through the bevelled edge portions to form a dopant stripe across the thickness of the semiconductor film material, which dopant stripe is at least partly retained in the thin-film transistors as a dopant edge (i.e. side wall) to the channel regions for reducing leakage currents along the edges (i.e. side walls) of the channel region in operation of the transistors.

By implanting, through the bevelled edge portions, such a dopant stripe across the thickness of the semiconductor film material where the edges (i.e. side walls) of the transistor bodies have been formed or are to be formed, a significant reduction in leakage current can be achieved. This reduction in leakage current seems to result from a reduction in edge effects along the edges (i.e. side walls) of the channel region. The actual effects and the precise mechanism are not understood, as is described later. Due to the masking effect of the bulk of the masking pattern, the bulk of the TFT body is not affected by the implant. The dopant stripe is formed by the peak of the implant extending across the thickness of the semiconductor film material, as the depth to which the peak penetrates in the film at any given point is determined by the thickness of the bevelled edge portion over that point. Thus, the doping level of the dopant stripe can be substantially homogeneous across the thickness of the film material below the bevelled edge portion, so giving a substantially uniform doping level at the edges of the transistor bodies.

The dopant stripe may be implanted into the TFT semiconductor film bodies after the etching step (c). However, a more independent control of the doping profile in relation to the edge profile of the bodies is obtained when the implantation step (e) is carried out before etching away the unmasked areas of the semiconductor film in step (c); in this case, the unmasked areas of the semiconductor film are subsequently etched away in step (c) to leave the transistor film bodies with the dopant stripe along their edges.

When the implantation step (e) is carried out before the etching step (c) the energy of the ions may be sufficiently high that at least most of the ions entering the unmasked areas of the semiconductor film are implanted into the underlying substrate. Depending on the etching treatment used in step (c) and the magnitude of the doping concentration, the presence of the implanted dopant in an area of the semiconductor film may slow the etching of that area. However, by implanting the dopant mostly into the substrate at the unmasked areas, the dopant has little (if any) effect in reducing the etching rate of the unmasked areas, and indeed the implantation damage in these unmasked areas due to the penetration of the dopant ions may even increase the etching rate so facilitating the etching away of these areas. In this situation, the etching away of the unmasked areas in step (c) may be effected with a chemical etchant which has a faster etching rate for the undoped unmasked areas than for the dopant stripe.

The ions may be implanted with an energy range which is sufficiently wide that the dopant stripe is present in most of the semiconductor film material underneath the bevelled edge portions of the masking pattern. In this situation, a wide dopant stripe can be formed, depending on the extent of any lateral etch back of the film material under the edges of the masking pattern either before or after the implantation step (e). When this implantation is carried out before etching the film, the dopant stripe can be exposed across the film thickness in etching step (c) without needing to etch back laterally under the edge portions of the masking pattern. Thus, for example, an anisotropic etching process may be used to etch away the unmasked areas of the film in step (c).

It is possible to form the bevelled edge portions in an insulating dielectric material by an enhanced etch back at the top surface of this material. Thus, the masking pattern (or at least its bevelled edge portions) may consist of such an insulating dielectric material on the semiconductor thin film. However, the bevelled edge portions can be defined most conveniently (in the present state of technology) by an edge-softening or edge-flow treatment such as is possible when the masking layer for the implanation step (e) comprises photoresist; the bevelled edges may be formed in a simple and controlled manner by heating the photoresist.

The masking pattern may be composed entirely of photoresist. However an insulating layer may be deposited on the semiconductor film before providing the photoresist, and this insulating layer may form part of the masking pattern during one or more of the manufacturing steps. Thus the pattern may be formed first in the photoresist and then etched into the insulating layer at least before the etching step (c), and the insulating layer may then be used as at least part of the masking pattern for the etching step (c). Such an insulating layer can form a very resistant mask for the etching step (c).

These and other features of the present invention are illustrated later with reference to specific embodiments of the invention depicted in the drawings.

Preferably an implant through the bevelled masking edge portions in accordance with the present invention is used in conjunction with other measures to reduce TFT leakage currents, assuming that a very low level of leakage current is desired in a particular device application.

Thus, the thin-film transistor may comprise a hydrogen-passivated polycrystalline semiconductor film body accommodating the channel region and having the opposite type dopant forming (across the thickness of the body) a dopant stripe which extends along the edges of the channel region to reduce leakage currents along the edges, and also having opposite type dopant across the back face of the channel region to suppress a leakage channel at the back face in accordance with the teaching in EP-A-0 408 129.

It should be noted that U.S. Pat. No. 4,252,574 describes a silicon-on-sapphire (SOS) n channel MOS transistor in which acceptor dopant is introduced into the p type epitaxial silicon layer on the sapphire substrate, immediately before etching the layer to produce transistor islands having a (100) crystallographic top face and (111) edges. The structure is then heated to a temperature of about 1000° C. to diffuse the acceptor dopant under the edge of the masking layer prior to the etching so that the (111) edges of the islands are more heavily doped than the lighter p type doping of the (100) top surface and bulk of the island. This heavy doping is to counteract the lower MOST threshold voltage which occurs at a (111) silicon plane, particularly after radiation exposure, as compared with the high threshold voltage at a (100) silicon plane. However, as will be appreciated by a reader skilled in the various arts of semiconductor device technology, the properties of a monocrystalline silicon layer epitaxially grown on a sapphire substrate are considerably different from those of a thin film of disordered material having a high density of trapping states such as is used for TFTs, and the characteristics of an MOS transistor formed with such a SOS structure (including its leakage current characteristics) are considerably different from the characteristics of a TFT formed with such a disordered thin film, even of polycrystalline silicon when hydrogenated or otherwise passivated.

BRIEF DESCRIPTION OF THE DRAWINGS FIGURES

Figure 2:
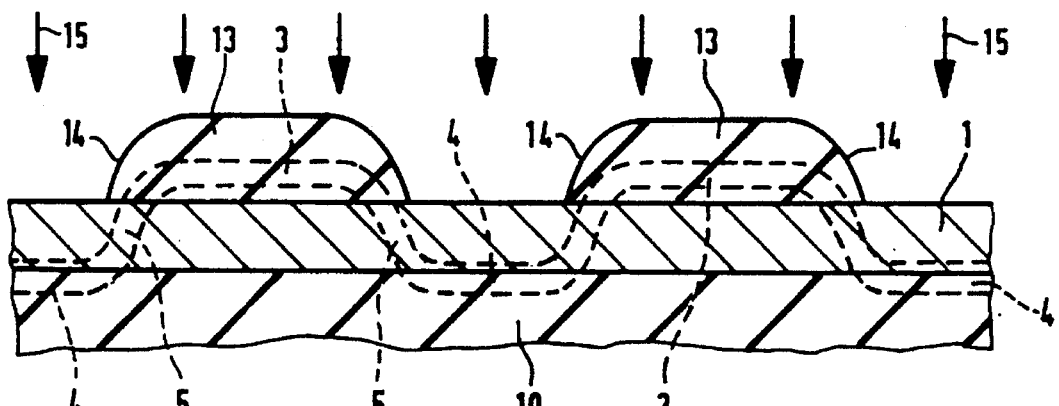
Figure 4:
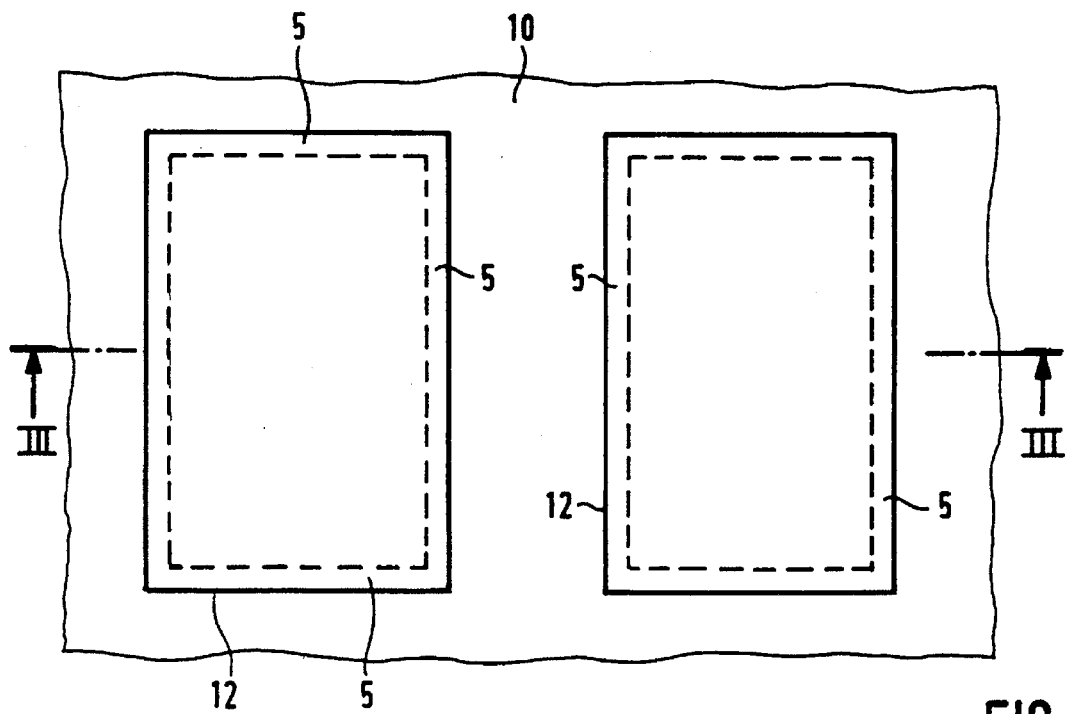
Figure 3:
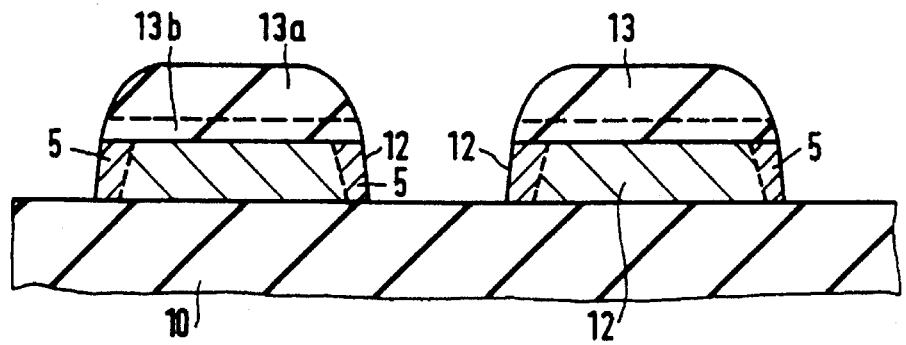
Figure 5:
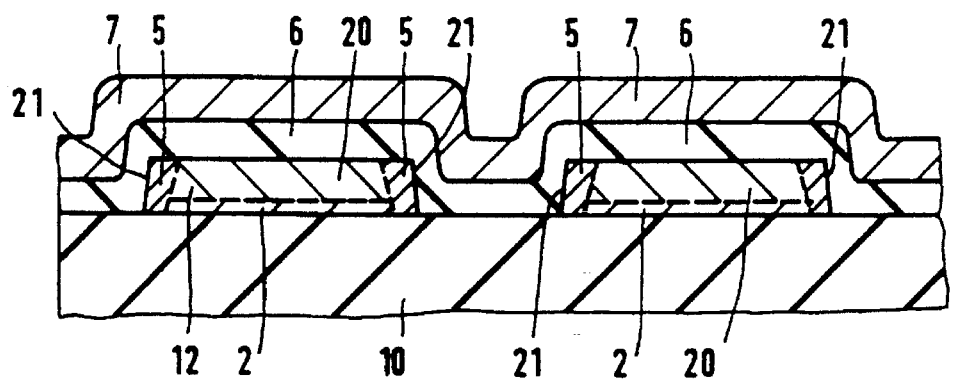
Figure 6:
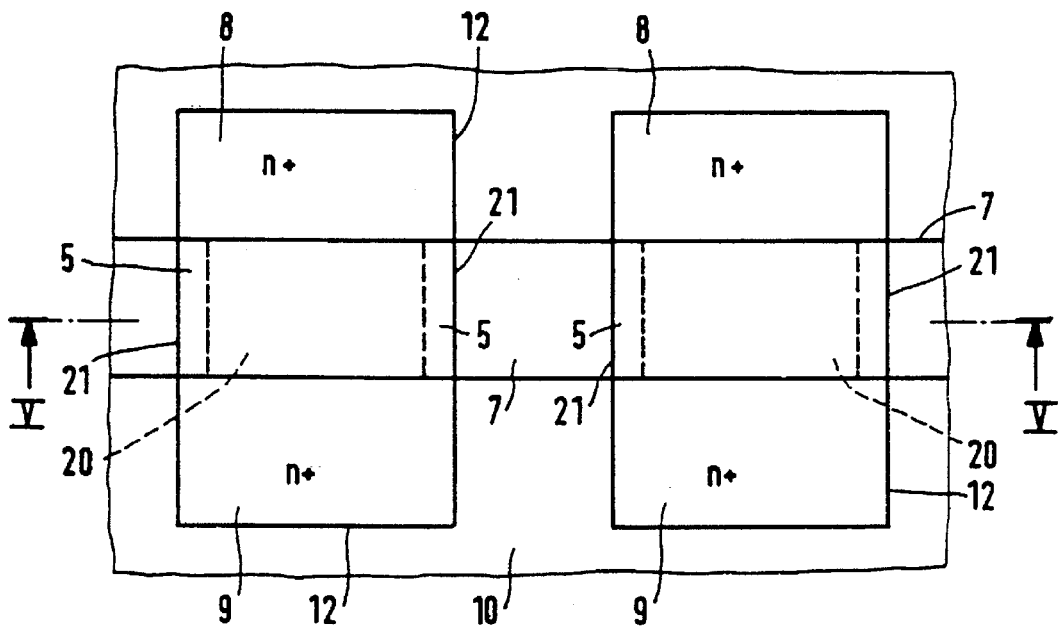
Figure 7:
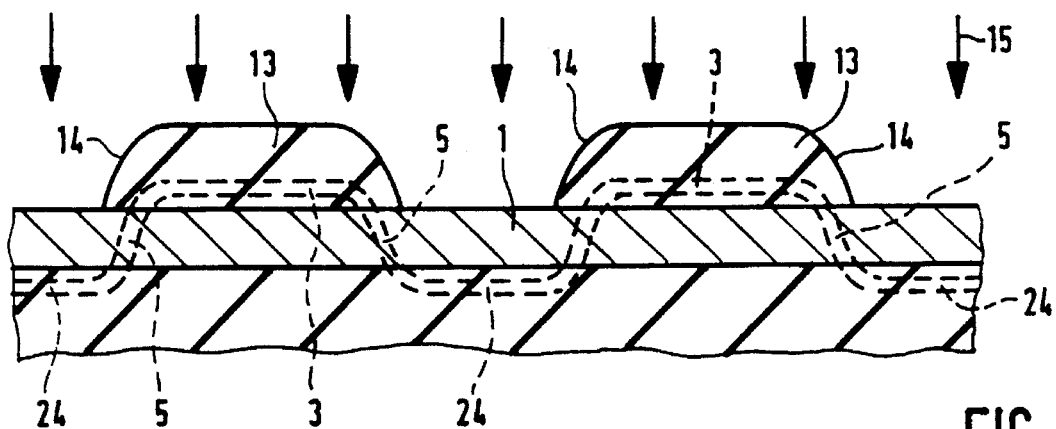
Figure 8:
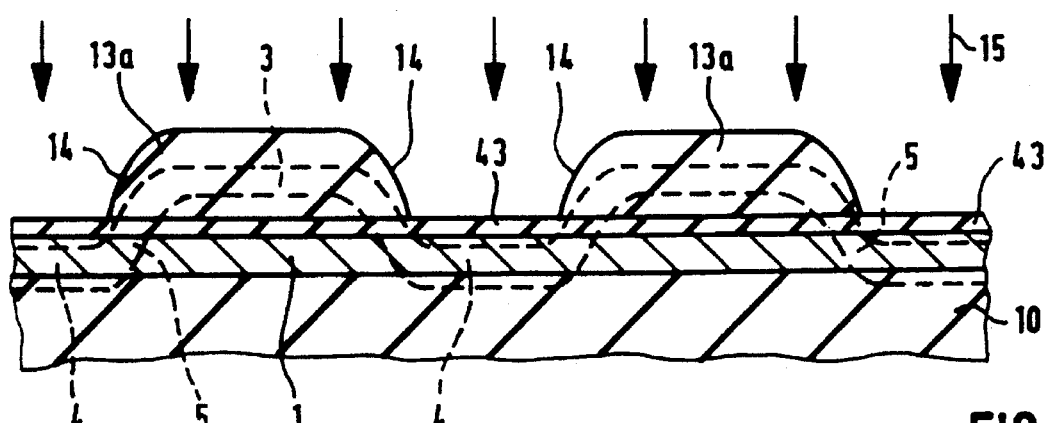
Figure 9:
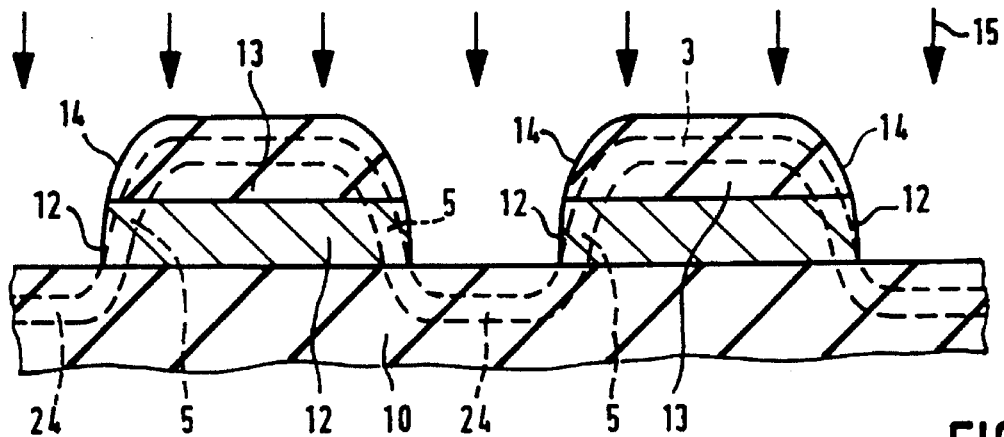

Various features of the present invention, and their advantages are illustrated specifically in embodiments of the invention now to be described, by way of example, with reference to the accompanying drawings, in which:

FIGS. 1, 2 and 3 and FIG. 5 are cross-sectional views of part of an electronic device at different stages in its manufacture in accordance with the invention, and showing the formation of two TFTs on the device substrate, FIGS. 4 and 6 are plan views of the device structure of FIGS. 3 and 5, the cross-section of FIG. 3 being taken on the line III—III of FIG. 4, and the cross-section of FIG. 5 being taken on the line V—V of FIG. 6, FIGS. 7 and 8 are cross-sectional views of part of an electronic device at the FIG. 2 implantation stage, showing variants of the FIG. 2 arrangement, and FIG. 9 is a similar cross-sectional view at the implantation stage, showing a further variant in the method also in accordance with the invention.

It should be noted that all the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

DESCRIPTION OF THE INVENTION

FIG. 1 shows a semiconductor film 1 of disordered material deposited on a substrate 10 which is to provide the substrate 10 of a large-area electronic device, for example a flat panel display such as a liquid-crystal display, or a large-area image sensor, or a data store. The device has thin-film circuitry, for example a matrix of TFT switching transistors and TFT drive circuits formed on the substrate 10. Thus, for example, the fabrication of two silicon n channel TFTs will be described and illustrated in FIGS. 1 to 8; in this example the film 1 is of polycrystalline silicon.

The substrate 10 is electrically insulating at least adjacent to its top surface. It may be of glass or any other low-cost insulating material, and in a particular embodiment it may be of the type described in EP-A-0 408 129, i.e. an upper layer of silicon dioxide on a base formed of a glass which is only capable of withstanding temperatures of less than 700° Celsius, for example up to about 650° Celsius. In general in TFT technology, the substrate imposes an upper limit of around this magnitude on the temperatures to which it can be subjected in the device processing.

The silicon film 1 may be deposited on the substrate 10 by a low pressure chemical vapour deposition (LPCVD) process, for example as described in EP-A-0 408 129. With a deposition temperature of about 620° C. a polycrystalline silicon film 1 is formed. With a lower temperature (e.g. less than 550° C. with a LPCVD process, or between 200° C. and 300° C. with a plasma-enhanced CVD process) amorphous silicon material is deposited; this amorphous silicon material may be crystallised into polycrystalline material in known manner, by heating the structure 1,10 in a furnace to about 600° C. or by heating the film 1 with a laser beam. This heating step is carried out before the masking stage illustrated in FIG. 1. The polycrystalline silicon film 1 generally has intrinsic type conductivity due to the high density of energy levels near the middle of its energy bandgap; these mid-gap levels result from the presence of charge trapping states at the grain boundaries. The thickness of the film 2 may be less than, for example 0.1 μm in a specific TFT example.

In order to suppress an n type conduction channel at the face of the film 1 adjacent to the substrate 10, an acceptor dopant such as boron may be implanted as ions in this area, in accordance with the teaching in EP-A-0 408 129. Such a p type dopant layer is illustrated by reference 2 in FIG. 1, but is not shown for clarity in most of the subsequent drawings.

A masking pattern 13 is now provided on the silicon film 2; the pattern 13 may, for example, be defined photolithographically. The pattern 13 may be entirely of photoresist, or it may comprise photoresist on an insulating layer of, for example, silicon nitride or silicon dioxide, or it may be entirely of one or more insulating layers. The masking areas of the pattern 13 serve to mask the underlying areas of the film 1 where the TFTs are to be formed, both for the ion implantation stage of FIG. 2 (or 7 or 8 or 9) and for the etching stage of FIGS. 3 and 4.

In accordance with the present invention, the masking pattern 13 is provided with bevelled edges 14 for the implantation step as illustrated in FIG. 2. When at least the upper portion of the masking pattern 13 comprises photoresist, the photoresist pattern may initially be formed photolithographically with almost vertical edges as illustrated in FIG. 1, after which the photoresist may be heated to form the bevelled edge portions 14 by softening and a slight flowing of the material under surface tension. In a specific example, this heating may be carried out in a furnace at a temperature below 150° C. for a time of about 30 minutes or less. In the case of a masking pattern 13 of one or more insulating layers, a selective etching treatment may be used to undercut the layers at a photoresist window and so to form the bevelled edge 14 in the insulating layers, after which the photoresist is removed.

As illustrated by arrows 15 in FIG. 2, dopant ions are now implanted in the silicon film 1. As n channel TFTs are being formed in FIG. 1 to 8, the ions are of an acceptor dopant such as boron. The thickness of the masking pattern 13 is sufficiently large as to mask the underlying silicon film 1 against the ion implantation, except below the bevelled edge portions 14 where the ions are implanted through the bevelled edge portions 14 to form a p type dopant stripe 5 which extends across the thickness of the film 1. The implantation profile is illustrated in broken outline in FIG. 2; it consists of the ions 3 which are stopped in the bulk of the masking pattern 13, the dopant stripe 5 implanted in the film 1 through the bevelled edge portions 14 and the ions 4 implanted at the unmasked areas. As is the case with ion implantation not all the implanted ions are confined to the outlined areas 3,4 and 5, but the implantation profile has tails both behind and in front of the main implanted area.

In the particular embodiment of FIG. 2, the implantation energy of the ions 15 is sufficiently high that at least most of the ions 4 entering the unmasked areas of the film 1 are implanted into the underlying substrate 10 and so do not dope these unmasked areas of the film 1. The ions 15 may also be implanted with an energy range which is sufficiently wide with respect to the thickness of the bevelled edge portions 14 and the film 1 that the implanted stripe 5 fills most of the region of the film 1 underneath the bevelled edge portions 14.

The masking pattern 13 (or at least a lower portion 13b of this pattern 13) is now used as an etching mask to define the TFT bodies 12 from the film 1, as illustrated in FIGS. 3 and 4. A chemical etchant solution such as, for example, catechol may be used to etch away the unmasked areas of the film 1, especially when some laterally etching of the film 1 below the mask edge portions 14 is desired in order to expose the dopant stripe 5. However, a plasma etching process or other dry etching treatment may be used instead. FIGS. 3 and 4 show two film bodies 12 left on the substrate 10, after this etching step. These bodies 12 have the p type dopant stripe 5 extending around their whole lateral perimeter. The masking pattern 13 may now be removed from the bodies 12 before continuing the device processing.

This further device processing may involve heating the film bodies 12, both to activate the implanted dopant in the stripe 5 and to improve the crystal quality of the polycrystalline semiconductor material. This heating step may be carried out in a furnace (e.g. at about 600° C.) or using a laser beam. The subsequent processing may involve deposition, doping and hydrogenation steps such as described in EP-A-0 408 129.

FIGS. 5 and 6 illustrate two such later stages in the device manufacture, in which an insulating layer 6, for example of silicon dioxide, is deposited (or grown) to form a gate dielectric, and a conductive gate stripe 7 is provided on the insulating layer 6 over the part of the bodies 12 which forms the TFT channel region. This gate stripe 7 may be formed in known manner, by depositing a polycrystalline silicon film and then defining its pattern photolithographically. The polycrystalline silicon gate stripe 7 may be rendered conductive in known manner by the same donor doping step as is used to form n type source and drain electrode regions 8 and 9 in the bodies 12. For this purpose ions of a donor dopant (e.g. phosphorus or arsenic) may be implanted in the gate stripe 7 and in the areas of the film bodies 12 not masked by the gate stripe 7. After this implantation step, the semiconductor film bodies are heated (for example in a furnace at a temperature of about 600° C.) to activate the implanted donor dopant for regions 7,8 and 9. This heating treatment may also serve to activate or further activate the donor dopant for the regions 5 if not already fully activated by a previous heating treatment. During the heating treatment(s) to activate the implanted dopant (and during any other heating treatments), the substrate 10 is heated to a temperature not exceeding 650° C.

The resulting TFT structures which are illustrated in FIGS. 5 and 6 may then be capped with an insulating layer, provided with aluminium or other metal electrode connections and subjected to a plasma hydrogenation treatment as described in EP-A-0 408 129.

As can be seen from FIGS. 5 and 6, the p type dopant stripe 5 is retained in the manufactured TFTs as a dopant edge to the TFT channel regions 20 of the TFT bodies 12. The channel region 20 is between the source and drain 8 and 9 and below the insulated gate 7, and the dopant edge 5 extends along the edge (i.e. side-wall) 21 of the TFT body at the area of the channel region 20.

The precise mechanism by which the dopant stripe 5 reduces leakage currents along the edges 21 of the TFT channel region 20 is not understood, because there seem to be so many different factors contributing to that leakage current, as described previously. The Applicants believe that the presence of the dopant stripe 5 of the second conductivity type (p type in FIGS. 5 and 6) prevents the formation of a conduction channel of the first conductivity type (n type in FIGS. 5 and 6) along the edge 21 and changes the edge surface from behaving as intrinsic material (in which electron-hole pairs are generated from the high density of mid-gap states) to p type material in which the electron-hole generation is significantly reduced. By controlling the ion dose and ion energy spread, it is possible to control the extent to which the edge surface 21 exhibits p type properties. In the specific embodiment described with reference to FIGS. 1 to 6, the dose of boron ions 15 implanted in the polycrystalline silicon film 1 may be in the range of $10^{12}$ $cm^{-2}$ to $10^{14}$ $cm^{-2}$, with an energy of, for example, about 180 keV for a film thickness of about 80 nm (nanometres). A photoresist mask 13 for this implantation may be about 1 μm in thickness. The implanted dopant may be activated to give a doping concentration in the range of $10^{16}$ to $10^{18}$ $cm^{-3}$. Thus, for example, with a dose of $10^{14}$ $cm^{-2}$ a peak doping concentration of about $10^{18}$ $cm^{-3}$ can be obtained in the dopant stripe 5, whereas the doping concentration below the bulk of the photoresist pattern 13 is less than $3\times10^{12}$ $cm^{-3}$ and that in the unmasked areas of the film 1 is less than $8\times10^{13}$ $cm^{-3}$. With a dose of $10^{12}$ $cm^{-2}$ the peak concentration in the stripe 5 is reduced to about $4\times10^{16}$ $cm^{-3}$, and the doping concentrations in the other areas of the film 1 are similarly reduced.

Many modifications and variants are possible within the scope of the present invention. Two such variations of the implantation step of FIG. 2 are illustrated in FIGS. 7 and 8 and will be considered below. In the situation illustrated in FIG. 2, most of the ions 15 entering the unmasked areas of the film 1 are implanted into the substrate area 4. Thus, in the etching step of FIG. 3, if an etchant is used having a slower etching rate for the doped regions of the film 1, then the dopant implanted through the unmasked areas in FIG. 2 has little (if any) effect on the etching rate of these unmasked areas. FIG. 7 illustrates a more extreme variant of this FIG. 2 situation in which a thicker masking pattern 13 and a high ion energy are used so that the ions 15 entering the unmasked areas of the film 1 are almost entirely implanted in an area 24 of the underlying substrate 10. In this case, a greater etch back of the film material below the edge portions 14 of the masking pattern 13 is required to remove the intrinsic material from the side walls (edges) of the bodies 12. However, some of the intrinsic material may be left on the side walls (edges) of the bodies 12, provided it is not sufficient to provide a conductive channel between source and drain 8 and 9.

FIG. 8 illustrates a quite different situation in which a wide energy range is used for the implantation 15 and a significant percentage of the dopant ions entering the unmasked areas are implanted in the semiconductor film 1. In this case, a directional (isotropic) etching treatment may be used to remove the unmasked areas with little undercutting of the mask edge portions 14. Thus, for example a reactive ion etching treatment may be used. FIG. 8 also illustrates the implantation of the ions 15 into the unmasked areas through a layer 43 on the surface of the semiconductor film 1. The implantation masking pattern of photoresist 13a is formed on this layer 43 which may be of, for example, silicon dioxide or silicon nitride. After the implantation step (e) of FIG. 8, this layer 43 may be etched into the masking pattern for the etching step (c) of FIG. 3. Thus, the remaining part of the layer 43 may provide the lower portion 13b of the etch masking pattern of FIG. 3. However the overlying photoresist 13a may be removed after defining the pattern 13b from the layer 43, and the remaining layer pattern 13b may form the entire etch masking pattern for the etching step (c). Thus the bevelled edge portions 14 need not be present during the etching step (c), and the composition of the masking pattern 13 may be quite different for the implantation step (e) and the etching step (c).

FIG. 9 illustrates yet another situation in which the etching step (c) has been carried out before the implantation step (e) for the dopant stripe 5. An isotropic etching treatment such as, for example, reactive ion etching may be used for the etching treatment to form the film bodies 12. When in this case the dopant stripe 5 is implanted as shown in FIG. 9, there are no unmasked areas of the film 1, and the implantation is effected into the side-walls (edges) of the TFT film bodies. Some slight isotropic etching of the side-walls (edges) of these bodies 12 may be carried out after the implantation step, if there is present between the implanted doped stripe 5 and the side-walls (edges) some insufficiently doped intrinsic material which it is desirable to remove.

The preceding description of Specific embodiments of FIGS. 1 to 8 has been in terms of the manufacture of n channel TFTs, i.e. TFTS in which the current flow through the intrinsic channel region 20 between the source and drain 8 and 9 is by electrons under the control of the insulated gate 7. However, p channel TFTs may be fabricated in accordance with the invention, for example with an arsenic-doped or phosphorus-doped implantation stripe 5 and with boron-doped source and drain 8 and 9. Arsenic or phosphorus ions may be used in this case for a back implant 2. The current flow through the intrinsic channel region 20 in this case is by holes under the control of the insulated gate 7.

Although FIG. 5 illustrates n type source and drain regions 8 and 9 formed in the intrinsic film bodies 12 by implantation, the n type source and drain regions 8 and 9 may be formed instead by doped films deposited initially on the substrate 10 or subsequently on the intrinsic film bodies 12.

Although FIG. 5 and FIGS. 1 to 3 illustrate the provision of the insulated gate 7 after the formation of the film bodies 12, an inverted TFT structure may be formed with a dopant stripe 5 in accordance with the invention. In this case, the gate 7 is first formed on the substrate 10, then the insulating layer 6, and then the film 1 is deposited. Thereafter the masking, implantation and etching steps of FIGS. 1 to 3 are carried out to form the intrinsic TFT bodies 12 with the dopant stripe 5 at their edges. Finally, the dopant implant 2 may be carried out at the top surface and the n type source and drain regions 8 and 9 may be deposited.

FIG. 6 illustrates the implanted edge stripe 5 extending along the whole length of the channel region edge 21 between the source 8 and drain 9. In this situation where the stripe adjoins the drain 9, it is advisable to avoid very high doping levels for the stripe 5 so as to avoid reducing the drain breakdown voltage. However it is also possible to mask the implant so as to space the stripe 5 from the drain 9, and in this situation higher doping levels may be used for the stripe 5.

The fabrication of TFTs from a polycrystalline silicon film has been described with reference to FIGS. 1 to 9. However a dopant stripe 5 (implanted through a bevelled edge portion 14 to reduce edge leakage) may also be included in TFTs having amorphous silicon thin-film bodies 12. The amorphous silicon film 1 may be formed in the manner described above for amorphous silicon deposition.

Furthermore, it is not even necessary to deposit a semiconductor material to provide the film 1. The disordered semiconductor film 1 may be formed by depositing a dielectric insulating material (for example, a silicon-rich non-stoichiometric insulating material of silicon oxide and/or nitride and/or carbide) and then converting the deposited material into polycrystalline silicon as described in European patent application EP-A-0 561 462 published on 22 Sep. 1993 (our reference PHB33784), the whole contents of which are hereby incorporated herein as reference material.

The present invention may also be used in TFTs formed from semiconductor materials other than silicon which are already known for TFT fabrication.

From reading the present disclosure, other variations and modifications will be apparent to persons skilled in the art. Such variations and modifications may involve equivalents and other features which are already known in the design, manufacture and use of thin-film transistors in electronic devices, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing an electronic device comprising thin-film transistors formed on a substrate by steps which include: (a) depositing a disordered material on the substrate to provide a semiconductor film in which channel regions of the transistors are to be accommodated, charge-trapping states being present in the semiconductor film, (b) providing a masking pattern on the semiconductor film to mask areas where the thin-film transistors are to be formed, (c) etching away the unmasked areas of the film from the substrate to leave semiconductor film bodies for the transistors, and (d) providing the semiconductor film bodies with electrodes forming a source, a drain and an insulated gate of each transistor, the transistor current flow through the channel region between the source and drain being by charge carriers of a first conductivity type under the control of the insulated gate in operation of the transistor, which method is characterised in that the masking pattern is provided with bevelled edge portions which are present when an implantation step (e) is carried out to implant ions of a second conductivity type dopant into the semiconductor film material, the thickness of the masking pattern in step (c) being sufficiently large as to mask the underlying semiconductor film against implantation of the ions except below the bevelled edge portions where the ions are implanted through the bevelled edge portions to form a dopant stripe across the thickness of the semiconductor film material, which dopant stripe is at least partly retained in the thin-film transistors as a dopant edge to the channel regions for reducing leakage currents along the edges of the channel region in operation of the transistors.

2. A method as claimed in claim 1, further characterised in that the implantation step (e) is carried out before etching away the unmasked areas of the semiconductor film in step (c), and the unmasked areas of the semiconductor film are subsequently etched away in step (c) to leave the transistor film bodies with the dopant stripe along their edges.

3. A method as claimed in claim 2, further characterised in that the energy of the ions is sufficiently high that at least most of the ions entering the unmasked areas of the semiconductor film are implanted into the underlying substrate.

4. A method as claimed claim 1, further characterised in that the ions are implanted with an energy range which is sufficiently wide that the dopant stripe is present in most of the semiconductor film material underneath the bevelled edge portions of the masking pattern.

5. A method as claimed claim 1, further characterised in that the masking pattern for the implantation step (e) comprises photoresist, the bevelled edge portions being formed by heating the photoresist.

6. A method as claimed in claim 5, further characterised in that an insulating layer is deposited on the semiconductor film before providing the photoresist, the masking pattern is formed in the photoresist and is then etched into the insulating layer before the etching step (c), and the insulating layer is used as at least part of the masking pattern for the etching step (c).

7. A method as claimed claim 1, further characterised in that the semiconductor film bodies of the transistors are of polycrystalline material, and after the implantation step (e) the semiconductor film material is heated to activate the implanted dopant and to improve the crystal quality of the polycrystalline semiconductor material.

8. A method as claimed in claim 7, further characterised in that the substrate is heated not exceeding 650° C. during the heating treatment to activate the implanted dopant.

9. A method as claimed claim 1, further characterised in that doped source and drain electrodes are formed by implanting ions of a first conductivity type dopant in the semiconductor film bodies after the etching step (c), and the semiconductor film bodies are heated subsequently to activate the implanted dopants of both the first and second conductivity types.

10. A method as claimed in claim 9, further characterised in that the substrate is heated to a temperature not exceeding 650° C. during the heating treatment to activate the implanted dopant.

11. A method as claimed claim 1, further characterised in that the ions of the second conductivity type dopant are implanted in the semiconductor film to an implantation dose level in the range of $10^{12}$ cm$^{-2}$ to $10^{14}$ cm$^{-2}$.

* * * * *